United States Patent
Cheng

(10) Patent No.: US 6,453,987 B1
(45) Date of Patent: Sep. 24, 2002

(54) UNITARY HEAT-DISSIPATING FIN STRIP UNIT WITH STRAIGHT STRIP PORTIONS AND U-SHAPED STRIP PORTIONS

(76) Inventor: Chunyao Cheng, No. 115, Lane 210, Cheng-Ta 1st St., Wen-Shan Dist., Taipei City (TW)

( * ) Notice: Subject to any disclaimer, the term of this patent is extended or adjusted under 35 U.S.C. 154(b) by 0 days.

(21) Appl. No.: 10/045,935

(22) Filed: Oct. 19, 2001

(51) Int. Cl.[7] .................................................. F28F 7/00
(52) U.S. Cl. ...................... 165/80.3; 361/697; 361/704; 257/722
(58) Field of Search ................................ 165/80.3, 185; 361/704, 710, 697; 257/719, 722; 174/16.3

(56) References Cited

U.S. PATENT DOCUMENTS

| | | | | |
|---|---|---|---|---|
| 3,695,347 A | * | 10/1972 | Chartet | 165/152 |
| 5,311,928 A | * | 5/1994 | Marton | 165/185 |
| 5,375,655 A | * | 12/1994 | Lee | 165/185 |
| 6,034,467 A | * | 3/2000 | Roberts | 313/46 |
| 6,135,200 A | * | 10/2000 | Okochi et al. | 165/121 |

* cited by examiner

Primary Examiner—Allen Flanigan
(74) Attorney, Agent, or Firm—Brooks & Kushman P.C.

(57) ABSTRACT

A unitary heat-dissipating fin strip unit includes a series of straight strip portions, each adjacent pair of which define a heat-dissipating space therebetween, and a plurality of bridging units disposed respectively within the heat-dissipating spaces. Each of the bridging units includes a plurality of pressed and staggered first and second U-shaped strip portions interconnecting the straight strip portions. The first U-shaped strip portions of each of the bridging unit are disposed on one side of the corresponding straight strip portions, and are arranged in series. The second U-shaped strip portions of each of the bridging unit are disposed on the opposite side of the corresponding straight strip portions, and are arranged in series in the same manner as the first U-shaped strip portions.

2 Claims, 12 Drawing Sheets

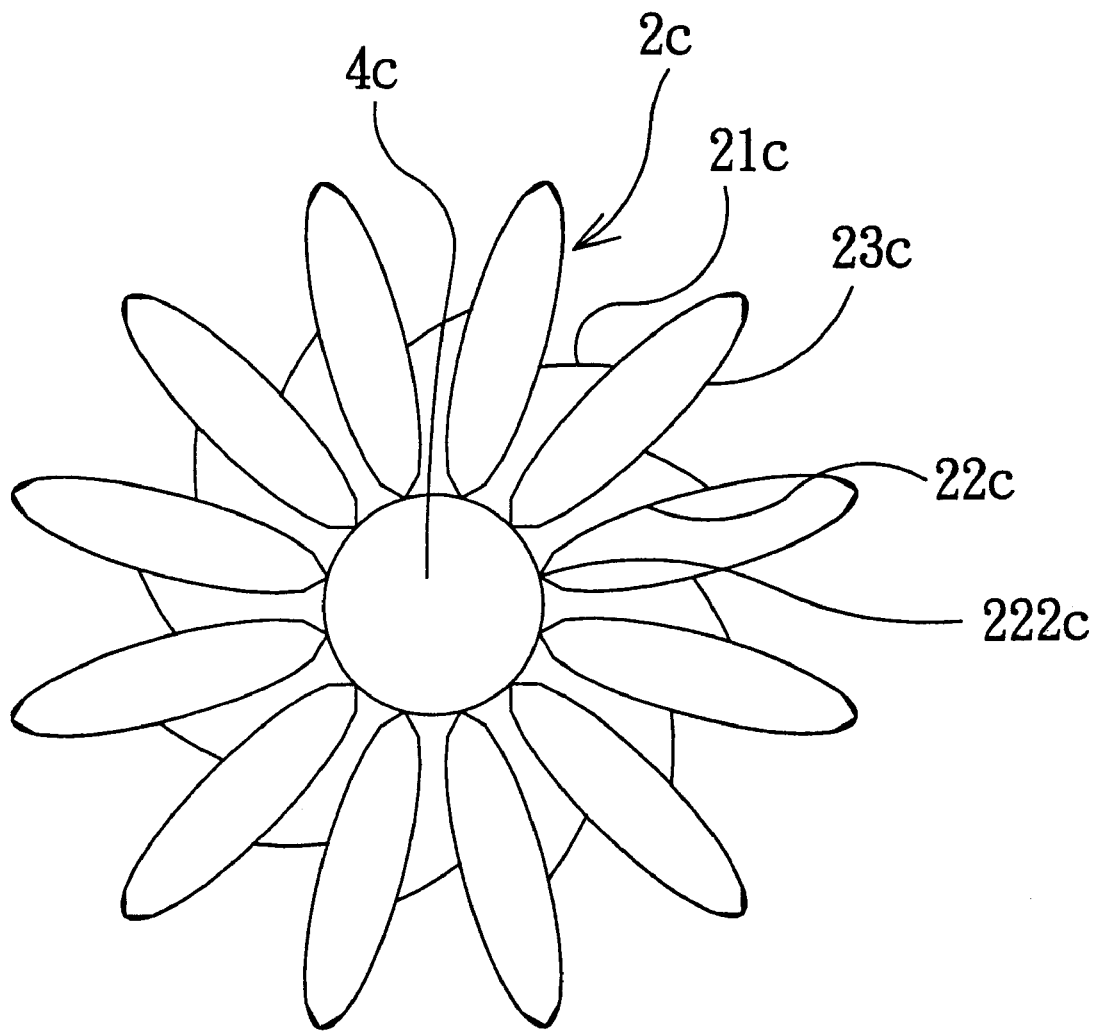
F I G. 10

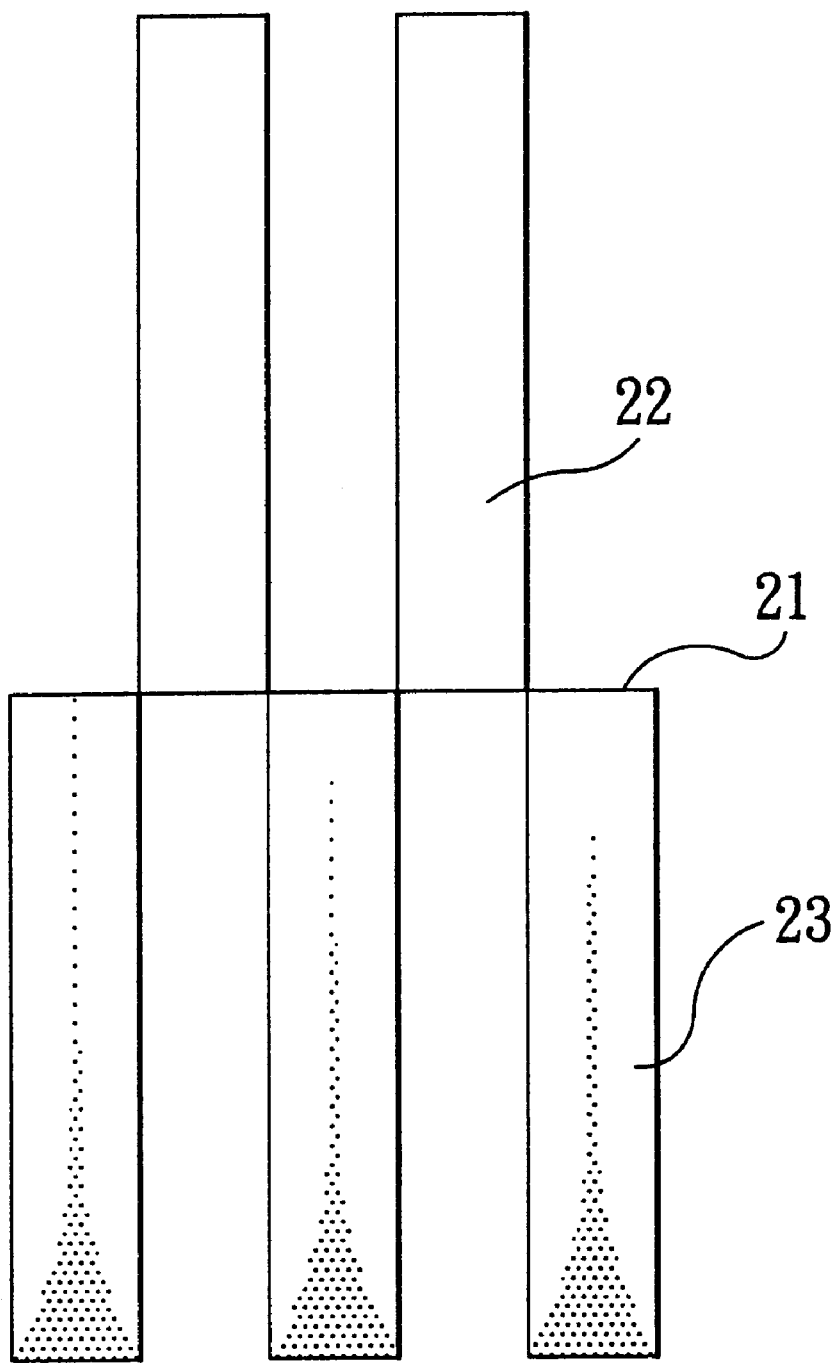
F I G. 12

UNITARY HEAT-DISSIPATING FIN STRIP UNIT WITH STRAIGHT STRIP PORTIONS AND U-SHAPED STRIP PORTIONS

BACKGROUND OF THE INVENTION

1. Field of the Invention

The invention relates to a heat-dissipating fin unit, more particularly to a unitary heat-dissipating fin strip unit with a relatively high heat-dissipating efficiency.

2. Description of the Related Art

FIG. 1 illustrates a conventional heat dissipating device 6 that includes a base plate 61 having a bottom surface that contacts and that is in thermal communication with a heat-generating source (not shown), a plurality of fin posts 62, each adjacent pair of which are spaced apart from each other and are provided on the base plate 61, and a heat-dissipating fan 63 provided on the fin posts 62 for blowing air toward or drawing air from the fin posts 62. FIG. 2 illustrates another conventional heat dissipating device 7 that includes a base plate 71, a plurality of fin plates 72 provided on the base plate 71, and a fan 73 provided on the fin plates 72. Each of the fin plates 72 is formed with a plurality of holes 721 for increasing flow paths of air among the fin plates 72.

As shown in FIGS. 1 and 3, due to the factors of material, size and thickness of the fin posts 62 of the conventional heat dissipating device 6, a large amount of heat (indicated by dotted areas in FIG. 3) accumulates easily in the interior of each fin post 62, and due to insufficient surface area for dissipating heat, the heat-dissipating effect is limited. As shown in FIGS. 2 and 4, since the fin plates 72 of the conventional heat dissipating device 7 are in plate form, heat is dissipated primarily from the upper portion of each fin plate 72, which is nearer to the fan 73, such that a large amount of heat accumulates easily in the lower portion of each fin plate 72. Furthermore, the fin posts 62 (see FIG. 1) and fin plates 72 used in the abovementioned heat dissipating devices 6, 7 (see FIGS. 1 and 3) are rigid and cannot be deformed for fitting heat-generating sources with various shapes and sizes.

SUMMARY OF THE INVENTION

Therefore, the object of the present invention is to provide a unitary heat-dissipating fin strip unit with a relatively high heat-dissipating efficiency.

According to one aspect of the present invention, a heat dissipating device comprises:

a base plate adapted to contact and to be in thermal communication with a heat-generating source; and a unitary heat-dissipating fin strip unit mounted fixedly on and in thermal communication with the base plate, the fin strip unit including a row of straight strip portions arranged along a first direction, each adjacent pair of the straight strip portions being spaced apart from each other so as to define a heat-dissipating space therebetween, and a plurality of bridging units disposed respectively within the heat-dissipating spaces, each of the bridging units including a plurality of pressed and staggered first and second U-shaped strip portions, each of which has two ends that are connected respectively to corresponding ones of the straight strip portions, the first U-shaped strip portions of each of the bridging units being disposed on one side of the corresponding ones of the straight strip portions and being arranged in a row along a second direction, which is transverse to the first direction relative to the straight strip portions, the second U-shaped strip portions of each of the bridging units being disposed on the opposite side of the corresponding ones of the straight strip portions and being arranged in a row along the second direction.

According to another aspect of the present invention, a unitary heat-dissipating fin strip unit is adapted for use in a heat dissipating device that includes a base plate. The fin strip unit comprises:

a series of straight strip portions arranged along a first direction, each adjacent pair of the straight strip portions being spaced apart from each other so as to define a heat-dissipating space therebetween; and a plurality of bridging units disposed respectively within the heat-dissipating spaces, each of the bridging units including a plurality of pressed and staggered first and second U-shaped strip portions, each of which has two ends that are connected respectively to corresponding ones of the straight strip portions, the first U-shaped strip portions of each of the bridging units being disposed on one side of the corresponding ones of the straight strip portions and being arranged in a row along a second direction, which is transverse to the first direction relative to the straight strip portions, the second U-shaped strip portions of each of the bridging units being disposed on the opposite side of the corresponding ones of the straight strip portions and being arranged in a row along the second direction, assembly of the straight strip portions and the first and second U-shaped strip portions being adapted to be disposed fixedly on and to be in thermal communication with the base plate.

According to still another aspect of the present invention, a unitary heat-dissipating fin strip unit is adapted to be disposed around and to be in thermal communication with a heat-generating source. The fin strip unit comprises:

a series of straight strip portions adapted to be arranged along a circumferential direction relative to the heat-generating source, each adjacent pair of the straight strip portions being spaced apart from each other so as to define a heat-dissipating space therebetween; and a plurality of bridging units disposed respectively within the heat-dissipating spaces, each of the bridging units including a plurality of pressed and staggered first and second U-shaped strip portions, each of which has two ends that are connected respectively to corresponding ones of the straight strip portions, the first U-shaped strip portions of each of the bridging units being disposed on one side of the corresponding ones of the straight strip portions and being arranged in series along a longitudinal direction relative to the straight strip portions, the second U-shaped strip portions of each of the bridging units being disposed on the opposite side of the corresponding ones of the straight strip portions and being arranged in a series along the longitudinal direction relative to the straight strip portions.

BRIEF DESCRIPTION OF THE DRAWINGS

Other features and advantages of the present invention will become apparent in the following detailed description of the preferred embodiments with reference to the accompanying drawings, of which:

FIG. 10 is a schematic top view showing the fourth preferred embodiment;

FIG. 12 is a schematic view illustrating the heat distribution of a fin strip unit of the heat dissipating device of the first preferred embodiment.

DETAILED DESCRIPTION OF THE PREFERRED EMBODIMENTS

Figure 1:
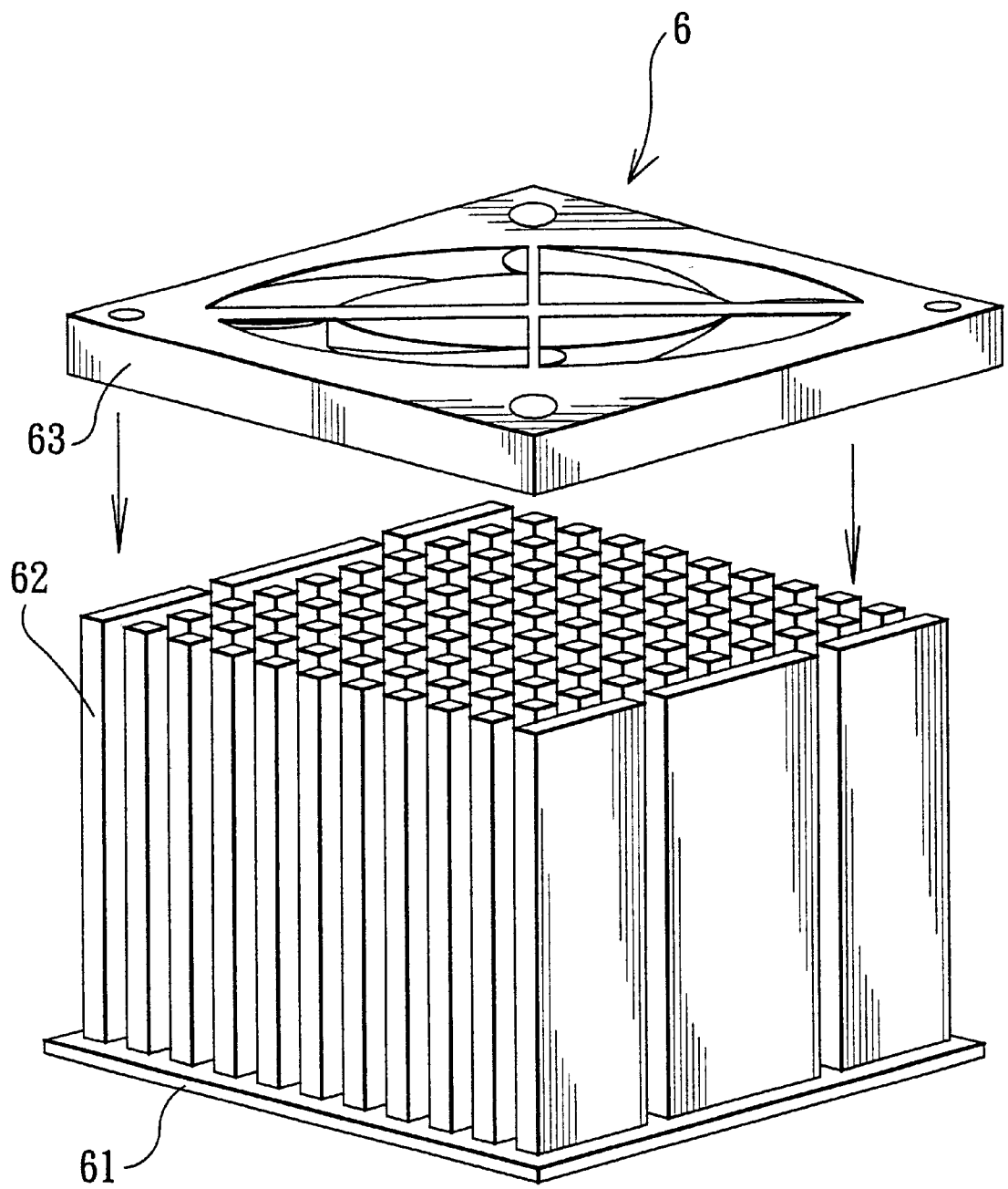
FIG. 1 is a partly exploded perspective view of a conventional heat dissipating device.
Figure 2:
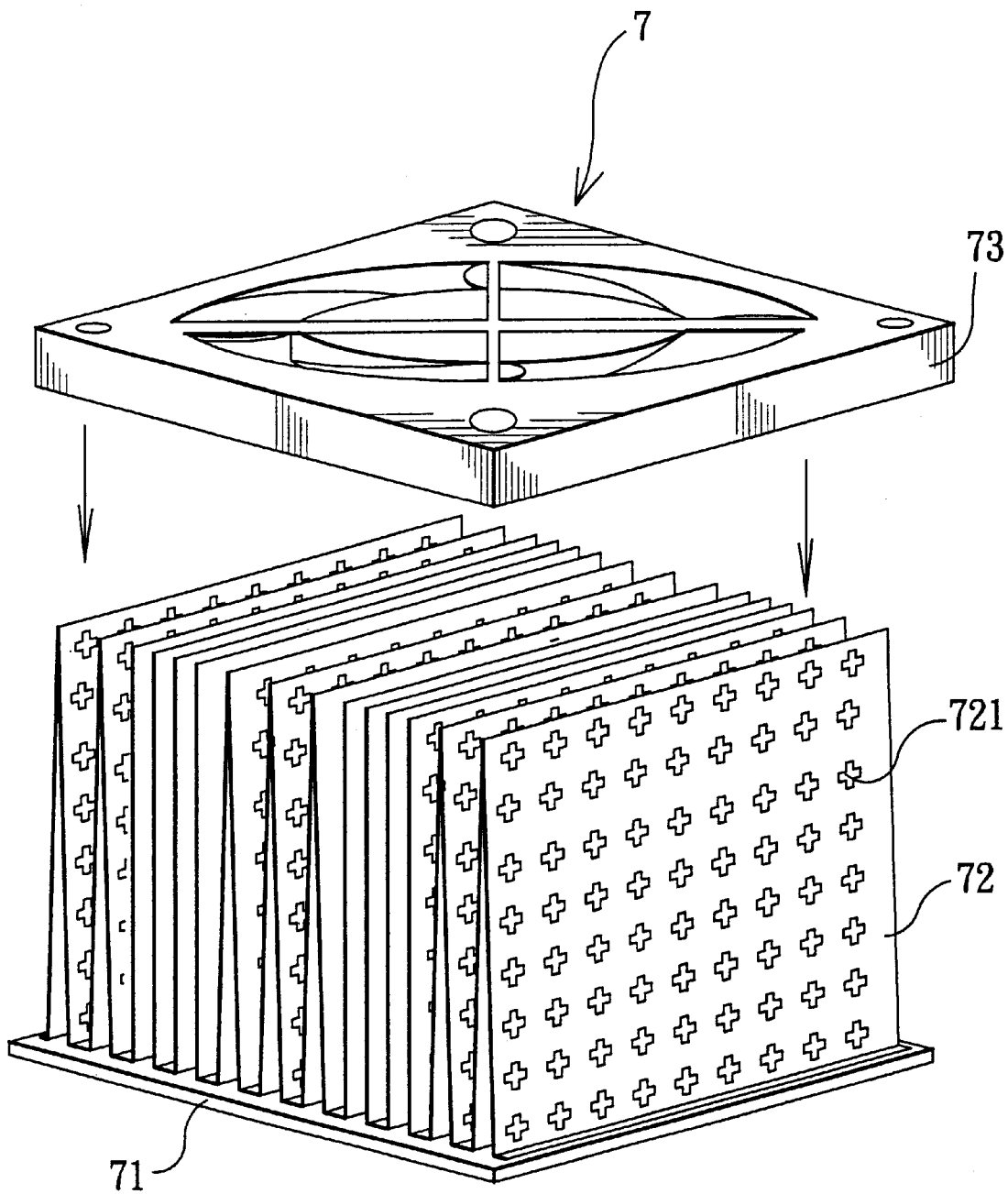
FIG. 2 is a partly exploded perspective view of another conventional heat dissipating device.
Figure 3:
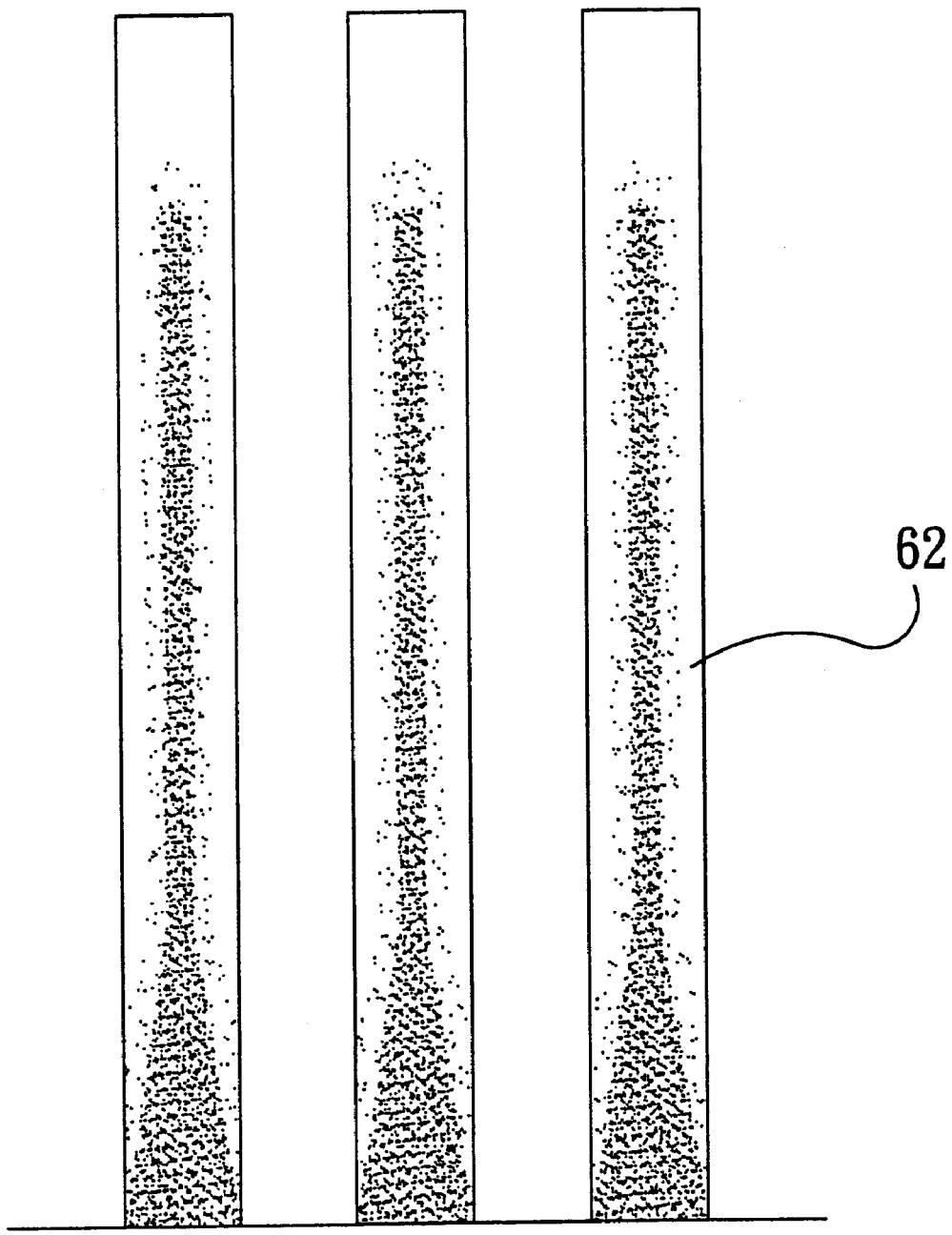
FIG. 3 is a schematic view illustrating the heat distribution of fin posts of the conventional heat dissipating device of FIG. 1.
Figure 4:
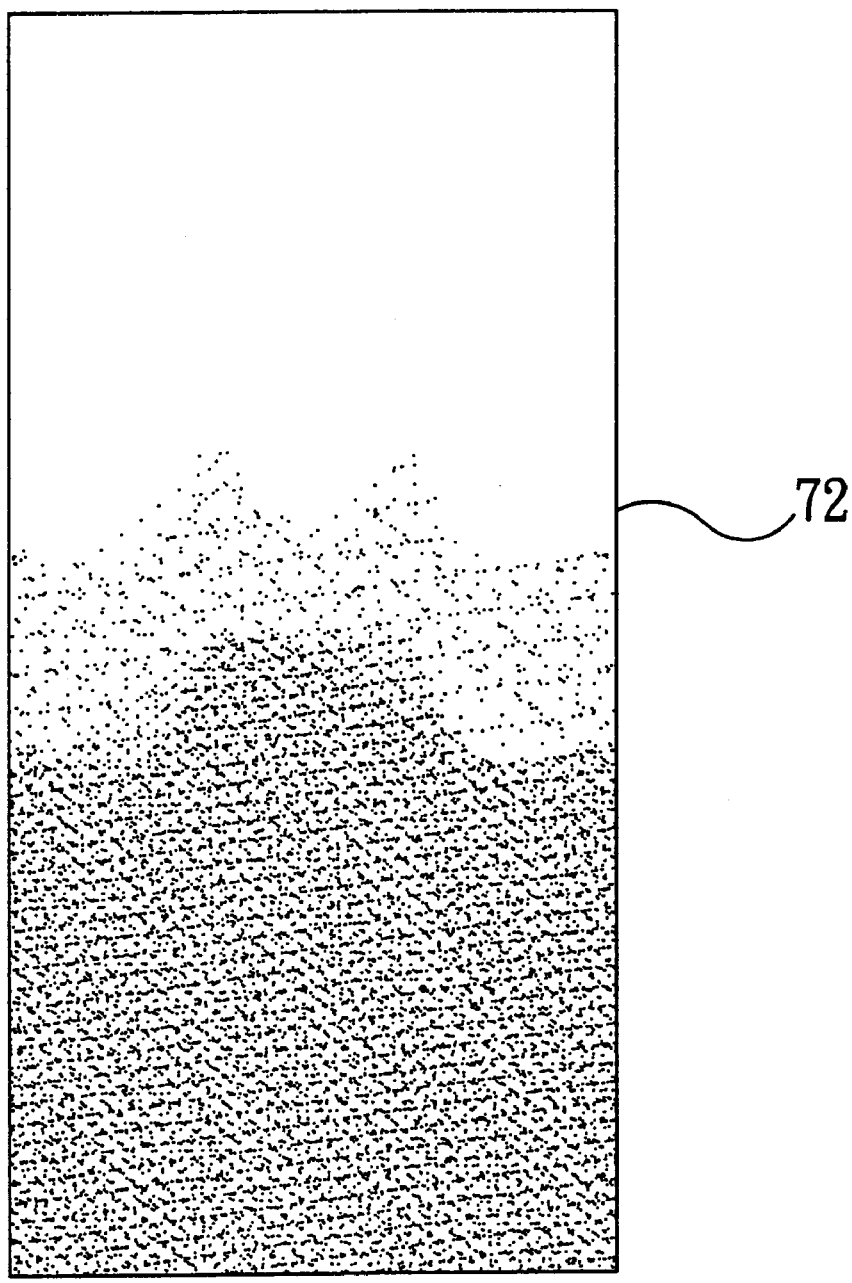
FIG. 4 is a schematic view illustrating the heat distribution of a fin plate of the conventional heat dissipating device of FIG. 2.

Before the present invention is described in greater detail, it should be noted that like elements are denoted by the same reference numerals throughout the disclosure.

Figure 5:
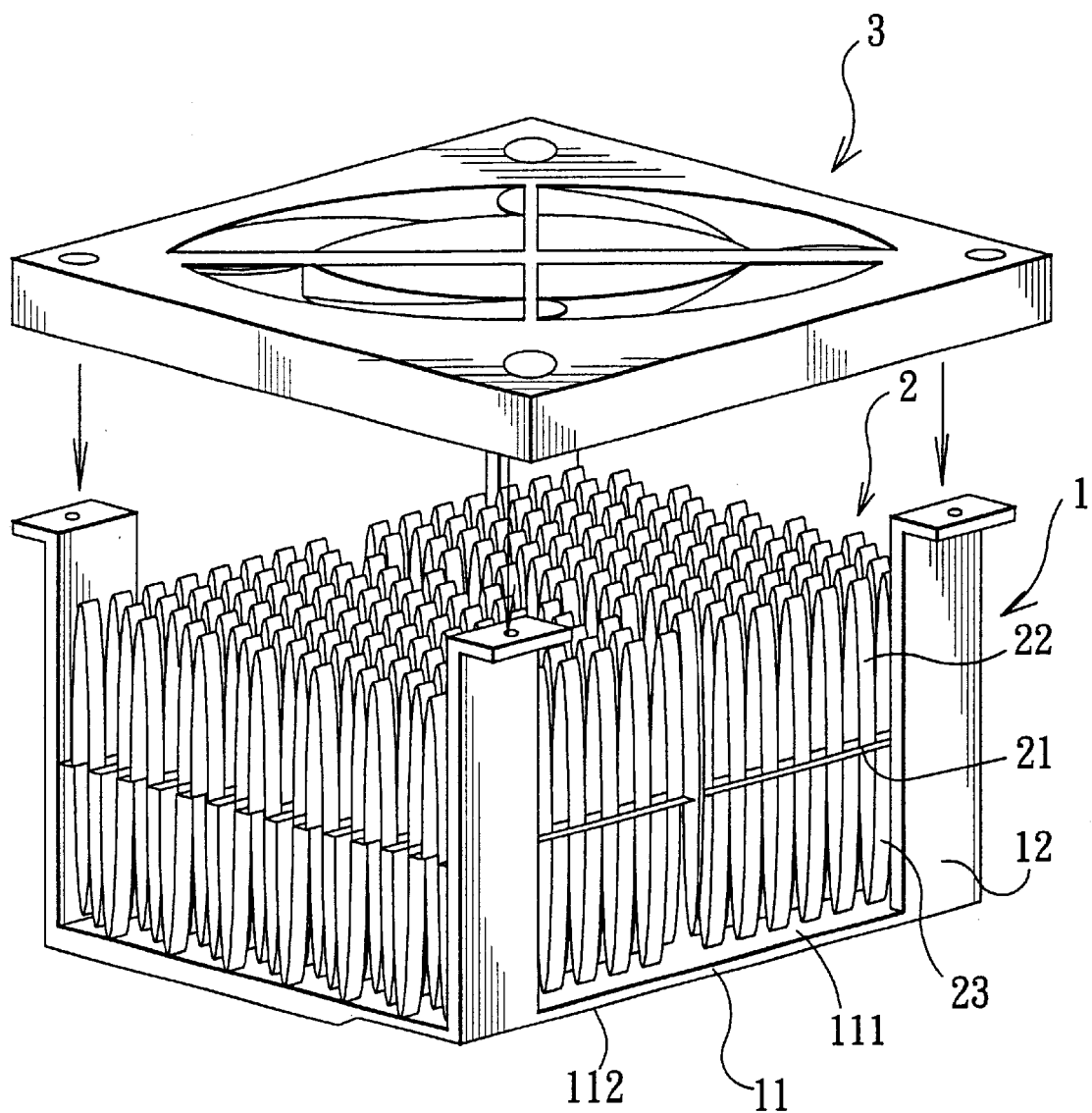
FIG. 5 is a partly exploded perspective view showing the first preferred embodiment of a heat dissipating device according to the present invention.

Referring to FIG. 5, according to the first preferred embodiment of the present invention, a heat dissipating device is shown to include a base unit 1, a unitary heat-dissipating fin strip unit 2, and a fan 3.

The base unit 1 is made of metal and includes a rectangular base plate 11 with a first surface 111, and a second surface 112 that is opposite to the first surface 111 and that is adapted to contact and to be is in thermal communication with a heat-generating source (not shown), and four mounting posts 12 extending respectively and upwardly from four corners of the first surface 111.

Figure 6:
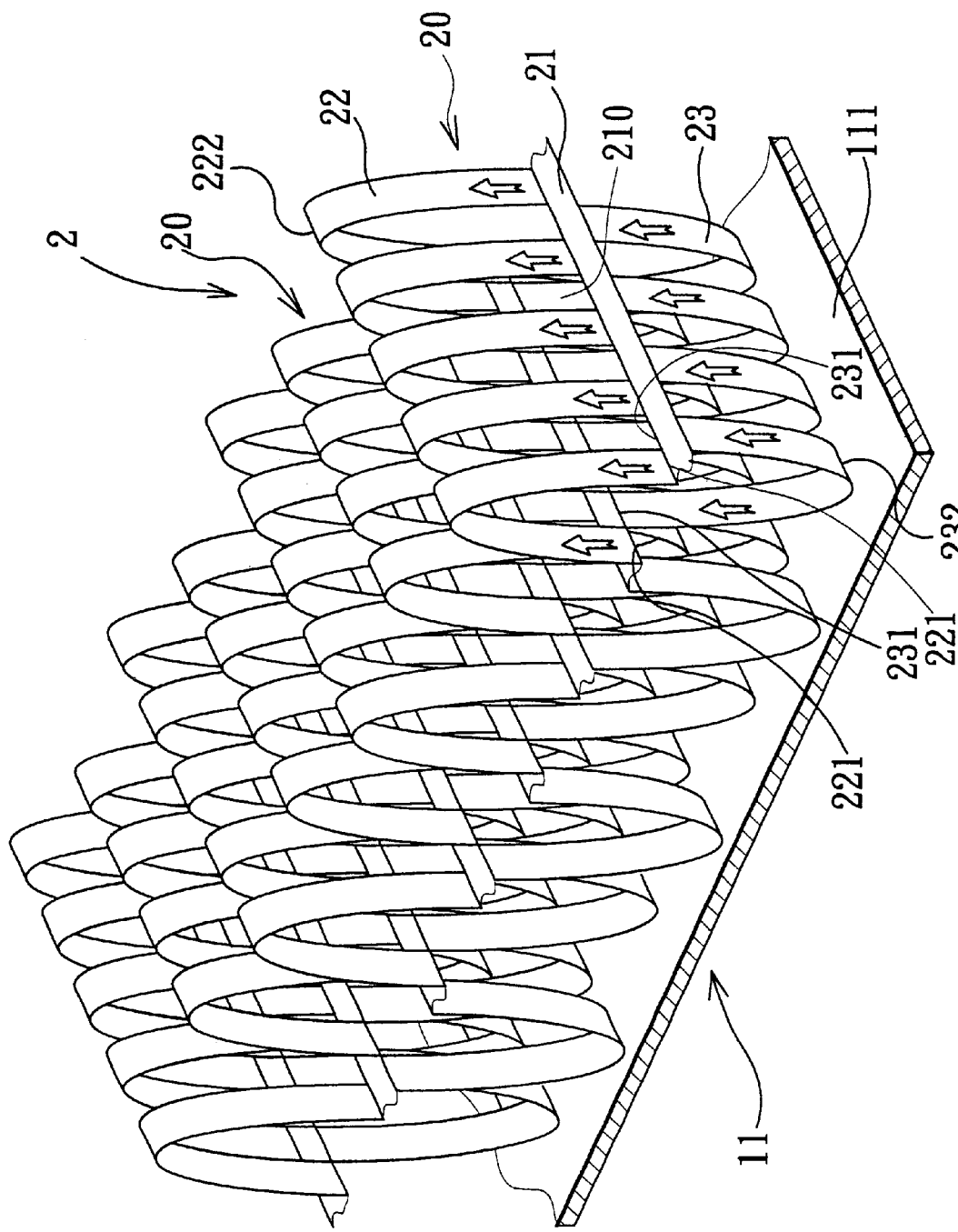
FIG. 6 is a fragmentary perspective view showing the first preferred embodiment.
Figure 11:
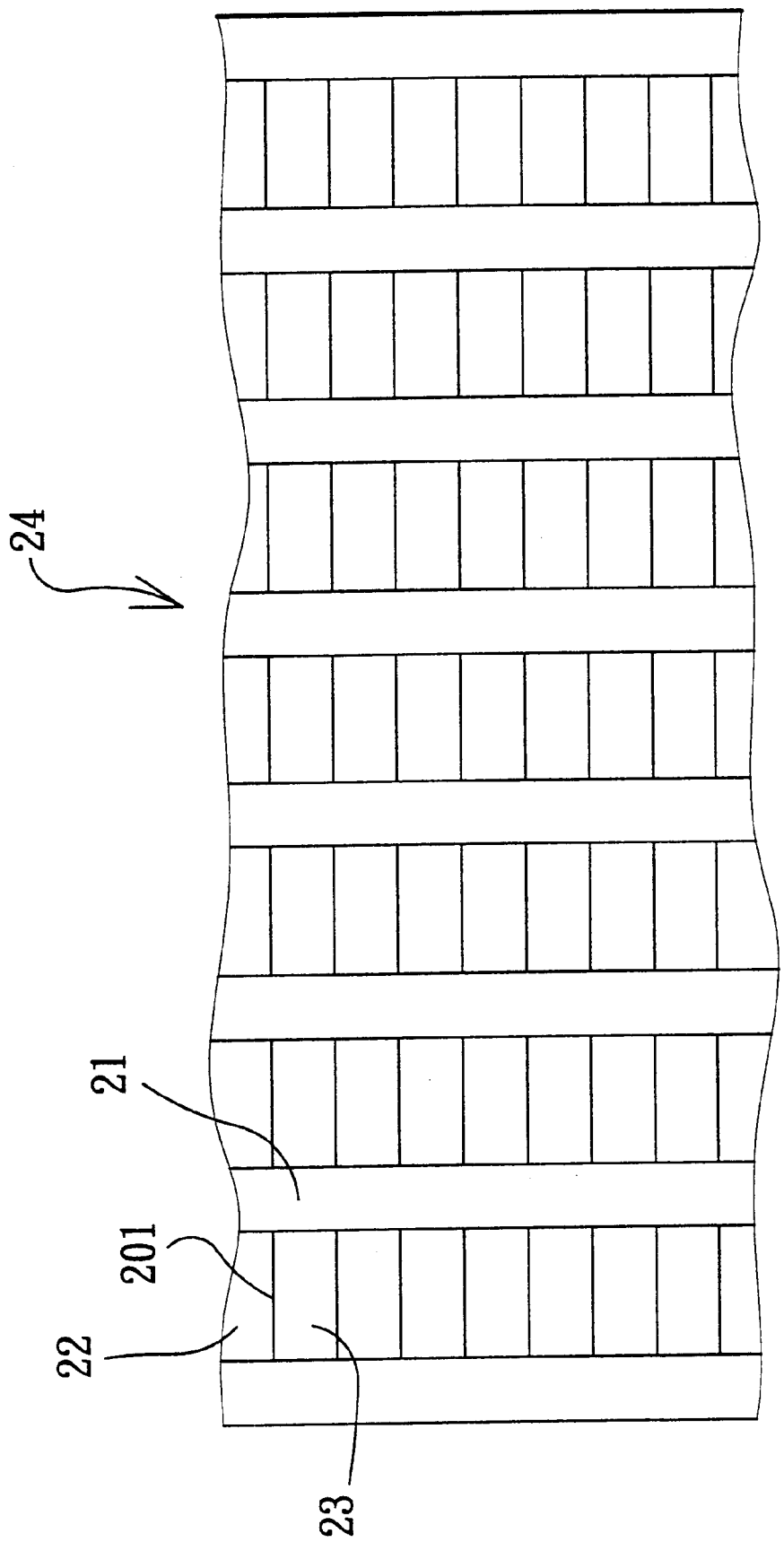
FIG. 11 is a schematic top view of a metal plate to be pressed so as to form a fin strip unit of the heat dissipating device of FIG. 6.

Referring to FIG. 6, the fin strip unit 2 is made of metal, and is mounted fixedly on and is in thermal communication with the base plate 11. The fin strip unit 2 includes a row of equidistant straight strip portions 21 arranged along a first direction, and a plurality of bridging units 20. Each adjacent pair of the straight strip portions 21 are spaced apart from each other so as to define a heat-dissipating space 210 therebetween. The bridging units 20 are disposed respectively within the heat-dissipating spaces 210. Each of the bridging units 20 includes a plurality of pressed and staggered first and second U-shaped strip portions 22, 23, each of which has two ends 221, 231 that are connected respectively to corresponding ones of the straight strip portions 21. The first U-shaped strip portions 22 of each of the bridging units 20 are disposed on one side of the corresponding ones of the straight strip portions 21, and are arranged in a row along a second direction, which is transverse to the first direction and parallel to the base plate 11. The second U-shaped strip portions 23 of each of the bridging units 20 are disposed on the opposite side of the corresponding ones of the straight strip portions 21, and are arranged in a row along the second direction. In this embodiment, as shown in FIGS. 11 and 12, the fin strip unit 2 can be formed by punching a thin metal plate 24 so as to form a plurality of parallel slits 201 and by pressing the plate 24 to form the first and second U-shaped strip portions 22, 23. Each of the first U-shaped strip portions 22 of the fin strip unit 2 has a bent portion 222. Each of the second U-shaped strip portions 23 of the fin strip unit 2 has a bent portion 232 that is fixed to the first surface 111 of the base plate 11, such as by soldering or sintering, and that is in thermal communication with the base plate 11. The straight strip portions 21 of the fin strip unit 2 are disposed in a plane that is parallel to the base plate 11.

The fan unit 3 (see FIG. 5) is disposed above the fin strip unit 2 and is mounted on the mounting posts 12 (see FIG. 5) of the base unit 1 (see FIG. 5) for blowing air toward or drawing air from the fin strip unit 2.

As such, the heat produced by the heat-generating source (not shown) can be conducted to the fin strip unit 2 via the base plate 11 along the direction of the arrows shown in FIG. 6.

Figure 7:
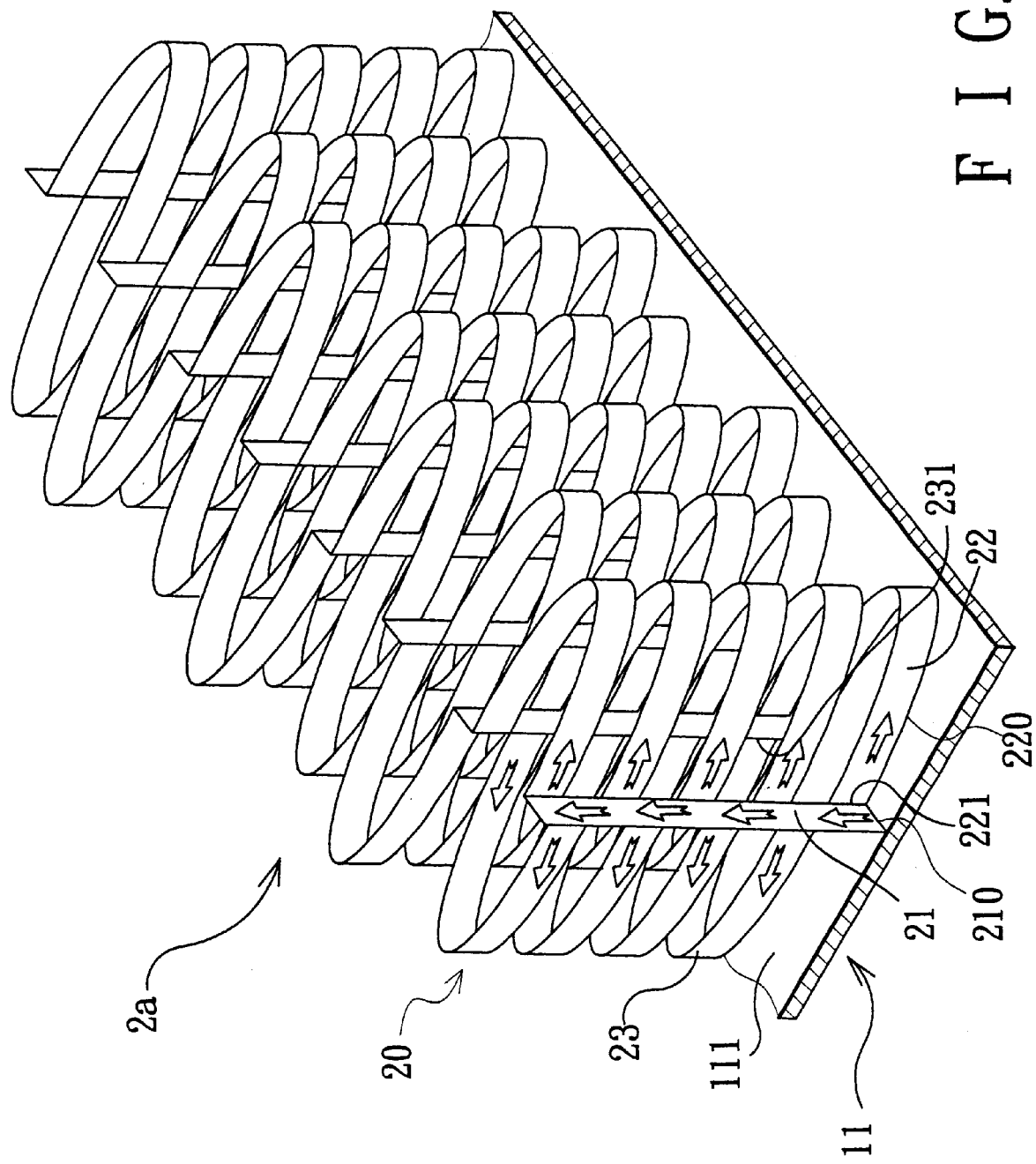
FIG. 7 is a fragmentary perspective view showing the second preferred embodiment of a heat dissipating device according to the present invention.

FIG. 7 illustrates the second preferred embodiment of a heat dissipating device according to this invention, which is a modification of the first preferred embodiment. Unlike the previous embodiment, the straight strip portions 21 of the fin strip unit 2a are disposed in a plane that is perpendicular to the base plate 11, and the first and second U-shaped strip portions 22, 23 are arranged in rows that are perpendicular to the base plate 11. Each of the straight strip portions 21 has an end 210 that is disposed fixedly on and that is in thermal communication with the base plate 11. The first U-shaped strip portions 22 of each bridging unit 20 have a lateral side 220 that is disposed fixedly on the first surface 111 of the base plate 11 and that is in thermal communication with the base plate 11. As such, the heat produced by heat-generating source (not shown) can be conducted to the fin strip unit 2a via the base plate 11 along the directions of the arrows shown in FIG. 7

Figure 8:
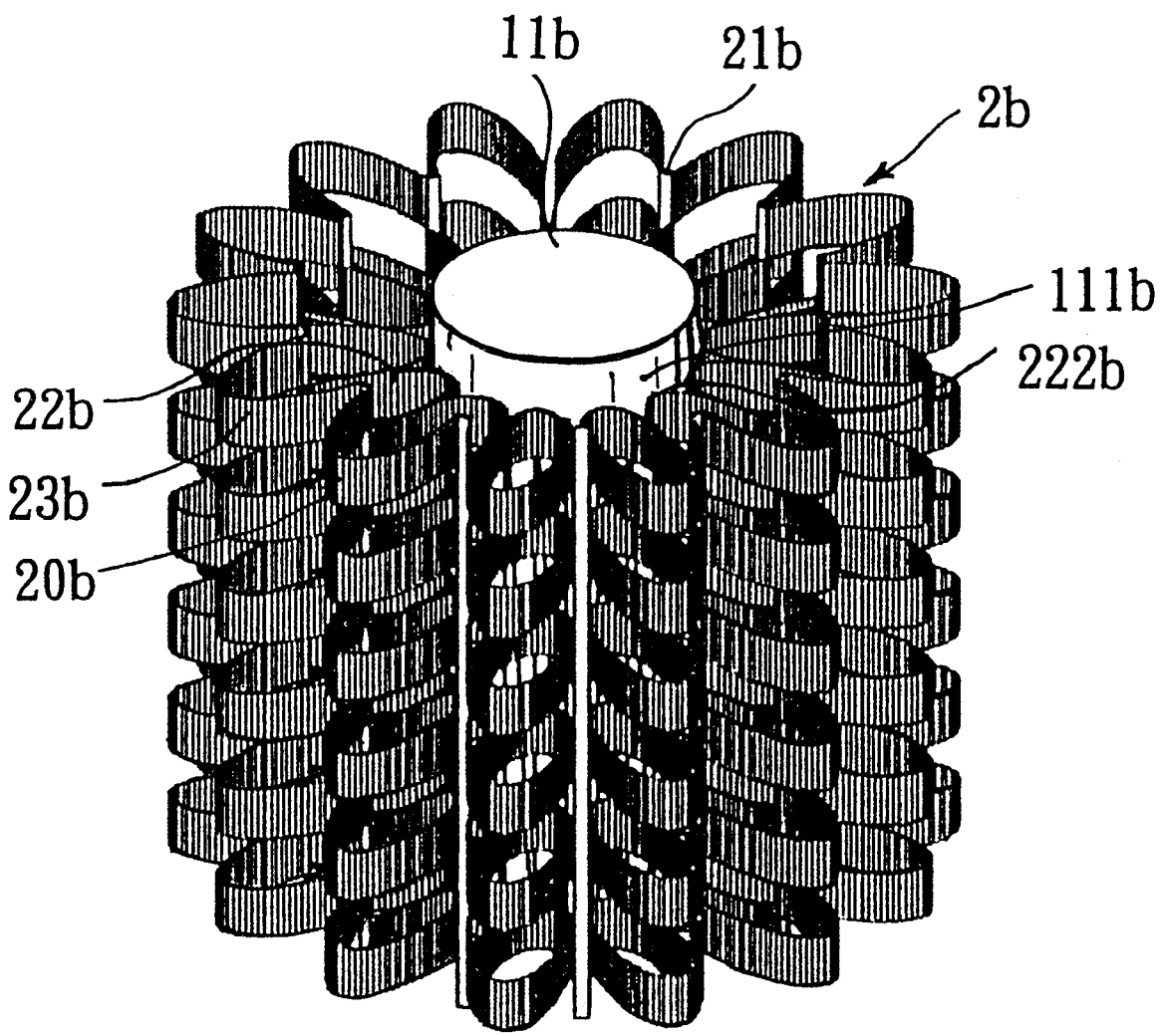
FIG. 8 is a perspective view showing the third preferred embodiment of a heat dissipating device according to the present invention.

Referring to FIG. 8, according to the third preferred embodiment of this invention, a heat dissipating device is shown to be adapted for dissipating heat generated by a cylindrical heat-generating source 11b, such as a motor, that has an outer surface 111b. The heat dissipating device includes a unitary heat-dissipating fin strip unit 2b adapted to be disposed around and to be in thermal communication with the heat-generating source 11b. The fin strip unit 2b includes a series of straight strip portions 21b and a plurality of bridging units 20b that are modifications of the first preferred embodiment. Unlike the first preferred embodiment, the straight strip portions 21b are adapted to be arranged along a circumferential direction relative to the heat-generating source 11b. The first U-shaped strip portion 22b of each bridging unit 20b are disposed on one side of the corresponding ones of the straight strip portions 21b, and are arranged in series along a longitudinal direction relative to the straight strip portions 21b. The second U-shaped strip portions 23b of each bridging unit 20b are disposed on the opposite side of the corresponding ones of the straight strip portions 21b, and are arranged in series along the longitudinal direction relative to the straight strip portions 21b. Each first U-shaped strip portion 22b has a bent portion 222b that is adapted to be disposed fixedly on and to be in thermal communication with the heat-generating source 11b. Each straight strip portion 21b extends in a tangential direction relative to the heat-generating source 11b.

Figure 9:
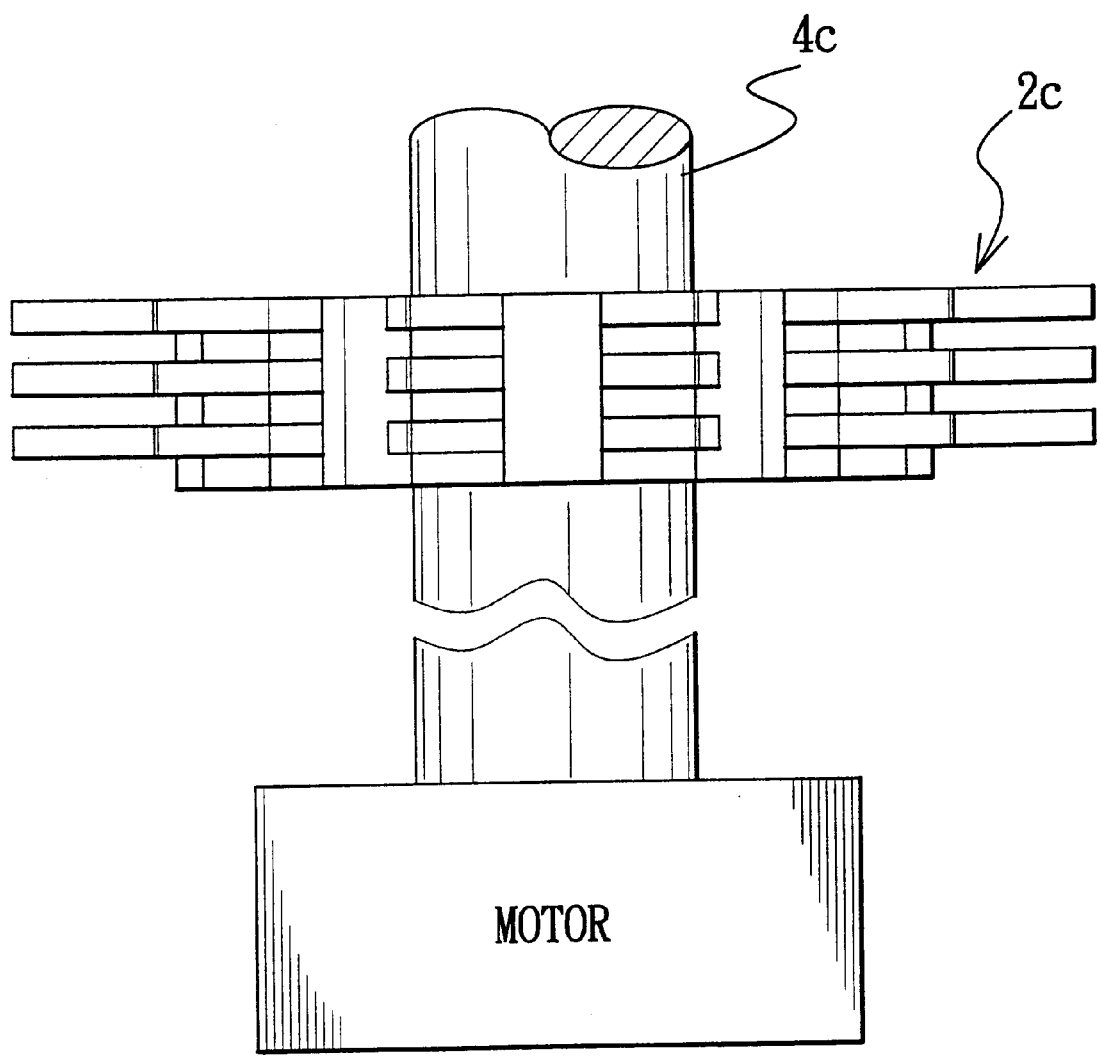
FIG. 9 is a schematic view showing the fourth preferred embodiment of a heat dissipating device according to the present invention.

FIGS. 9 and 10 illustrate the fourth preferred embodiment of a heat dissipating device according to this invention, which is a modification of the third preferred embodiment. Unlike the third preferred embodiment, the fin strip unit 2c is adapted to be disposed around a motor shaft 4c. As shown in FIG. 10, each of the straight strip portions 21c is inclined with respect to a radial direction of the motor shaft 4c. Since the fin strip unit 2c can be sleeved directly and mounted on the motor shaft 4c, fasteners for fastening the fin strip unit 2c can be omitted.

The following are some of the advantages of the present invention:

1. Due to the design of the first and second U-shaped strip portions, the heat dissipating device of this invention has a relatively large heat-dissipating area.

2. The first and second U-shaped strip portions are staggered so as to form a relatively large heat-dissipating space such that the heat-dissipating efficiency of the device according to this invention can be improved. In the first preferred embodiment, a relatively small amount of heat (indicated by dotted areas in FIG. 12) accumulates in the interior of each of the first and second U-shaped strip portions 22, 23.

3. The fin strip unit can be shaped to fit various shapes of heat-generating sources, thereby increasing its applicable range.

4. The fin strip unit can be formed by punching and pressing a thin metal plate, thereby resulting in a simplified manufacturing process.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A heat dissipating device comprising:

a base plate adapted to contact and to be in thermal communication with a heat-generating source; and a unitary heat-dissipating fin strip unit mounted fixedly on and in thermal communication with said base plate, said fin strip unit including a row of straight strip portions arranged along a first direction and disposed in a plane that is parallel to said base plate, each adjacent pair of said straight strip portions being spaced apart from each other so as to define a heat-dissipating space therebetween, and a plurality of bridging units disposed respectively within said heat-dissipating spaces, each of said bridging units including a plurality of pressed and staggered first and second U-shaped strip portions, each of which has two ends that are connected respectively to corresponding ones of said straight strip portions, said first U-shaped strip portions of each of said bridging units being disposed on one side of the corresponding ones of said straight strip portions and being arranged in a row along a second direction, which is transverse to the first direction and parallel to said base plate, said second U-shaped strip portions of each of said bridging units being disposed on the opposite side of the corresponding ones of said straight strip portions and being arranged in a row along the second direction, and each of said second U-shaped strip portions of said fin strip unit having a bent portion that is disposed fixedly on and that is in thermal communication with said base plate.

2. A heat dissipating device comprising:

a base plate adapted to contact and to be in thermal communication with a heat-generating source; and a unitary heat-dissipating fin strip unit mounted fixedly on and in thermal communication with said base plate, said fin strip unit including a row of straight strip portions arranged along a first direction, each adjacent pair of said straight strip portions being spaced apart from each other so as to define a heat-dissipating space therebetween and being disposed in a plane that is perpendicular to said base plate, each of said straight strip portions having an end that is disposed fixedly on and that is in thermal communication with said base plate, a plurality of bridging units disposed respectively within said heat-dissipating spaces, each of said bridging units including a plurality of pressed and staggered first and second U-shaped strip portions, each of which has two ends that are connected respectively to corresponding ones of said straight strip portions, said first U-shaped strip portions of each of said bridging units being disposed on one side of the corresponding ones of said straight strip portions and being arranged in a row along a second direction, which is transverse to the first direction and perpendicular to said base plate, said first U-shaped strip portions of each of said bridging units having a lateral side that is disposed fixedly on and that is in thermal communication with said base plate, and said second U-shaped strip portions of each of said bridging units being disposed on the opposite side of the corresponding ones of said straight strip portions and being arranged in a row along the second direction.

* * * * *